United States Patent [19]

Chiang et al.

[11] 4,173,496
[45] Nov. 6, 1979

[54] INTEGRATED SOLAR CELL ARRAY

[75] Inventors: Shang-Yi Chiang; Bernard G. Carbajal, both of Richardson, Tex.

[73] Assignee: Texas Instruments Incorporated, Dallas, Tex.

[21] Appl. No.: 910,329

[22] Filed: May 30, 1978

[51] Int. Cl.² .............................................. H01L 31/06
[52] U.S. Cl. .................................. 136/89 MS; 357/30; 357/47
[58] Field of Search .................... 136/89 P, 89 MS; 357/30, 47, 48

[56] References Cited

U.S. PATENT DOCUMENTS

| 3,546,542 | 12/1970 | Riel et al. | 317/234 |
| 3,812,521 | 5/1974 | Davis et al. | 357/48 |
| 3,994,012 | 11/1976 | Warner, Jr. | 357/30 |

OTHER PUBLICATIONS

A. I. Bennett et al., "An Integrated High-Voltage Solar Cell", Conf. Record, IEEE Photovoltaic Specialists Conf. (1967), pp. 148–159.

B. A. Augusta et al., "Monolithic Integrated Semiconductor Structure Having Epitaxially Formed Base Regions", *IBM Tech. Disc. Bull.*, vol. 9, pp. 546–547 (1966).

*Primary Examiner*—Aaron Weisstuch
*Attorney, Agent, or Firm*—Gary C. Honeycutt; Richard L. Donaldson; James T. Comfort

[57] ABSTRACT

An integrated, monolithic array of solar cells wherein isolation between cells permits series interconnection of the cells to provide an output voltage for the array equal to the sum of the voltages of the unit cells. Although normal PN junction isolation is ineffective when exposed to light, the present structure includes a form of junction isolation that is effective when exposed to light, or to other radiation. For example, a band of heavily doped P-type silicon, formed by thermomigration of aluminum through an N-type wafer, provides such isolation.

4 Claims, 2 Drawing Figures

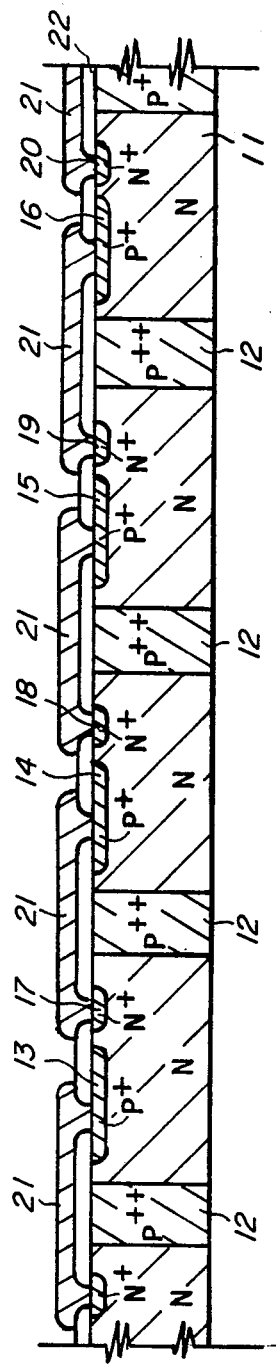
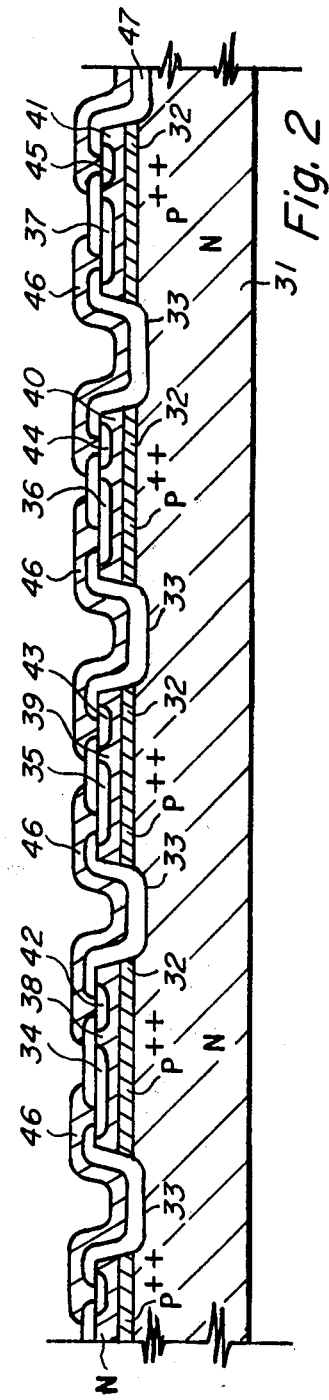
Fig. 1
Fig. 2

INTEGRATED SOLAR CELL ARRAY

This invention relates to photovoltaic semiconductor devices, commonly known as solar cells, and more particularly to an integrated monolithic array of solar cells wherein isolation between cells permits series interconnection of the cells to provide an output voltage for the array equal to the sum of the voltages of the unit cells.

The open circuit voltage, $V_{oc}$, of a PN junction silicon solar cell is determined by its physical properties, such as the band gap, reverse bias saturation current, and minority carrier lifetime; and is independent of the junction area. For increased junction area, the short circuit current, $I_{sc}$, increases approximately proportionately to the junction area, but the $V_{oc}$ remains unchanged. The typical $V_{oc}$ of a silicon PN junction solar cell is $0.6 \pm 0.05$ volts for normal sunlight. The $V_{oc}$ will rise about 0.06 volts for an order of magnitude increase in the light level if the cell follows the ideal diode characteristics. Similarly, the $V_{oc}$ will drop 0.06 volts for an order of magnitude decrease in the light level.

For high voltage (greater than 0.6 volts) applications, such as a battery recharger, several cells in series connection are required, in order to generate the necessary voltage output. Without proper isolation, cells fabricated in monolithic silicon cannot be connected in series because all the cells have a common base region. Therefore, the current state-of-the-art approach is to assemble discrete cells in series and to provide external interconnection means or "wiring" between chips. Such an approach introduces prohibitively high assembly costs, and the added reliability problem inherently characteristic of external interconnection means.

Accordingly, it is an object of the present invention to provide a low-cost technique for electrical isolation between unit cells of a monolithic array. More specifically, it is an object of the invention to provide an integrated monolithic array of solar cells wherein the output voltage ($V_{oc}$) for the array is equal to the sum of the voltages of the unit cells.

Although normal PN junction isolation is ineffective when exposed to light, the structure of the present invention includes a form of junction isolation that is effective when exposed to light, or to other radiation. For example, a band of heavily doped P-type silicon formed by thermomigration of aluminum through an N-type wafer provides such isolation.

Accordingly, one aspect of the present invention is embodied in an integrated solar cell array comprising a monocrystalline semiconductor body having a plurality of N-type regions extending to one surface thereof and isolated from each other by a plurality of heavily doped P-type regions. A shallow P-type region in each of the N-type regions is provided to form the junction of a unit solar cell of the array. A conductive film is provided on the surface of the body, patterned to complete the interconnection of cells in series, whereby the theoretical output voltage of the array is the sum of the voltages of the unit cells.

In one embodiment the heavily doped P-type regions extend vertically throughout the thickness of the semiconductor body in a direction normal to its surface.

Alternatively, the semiconductor surface may include a pattern of grooves which electrically isolate adjacent cells laterally, and wherein the heavily doped P-type regions extend horizontally between the groove patterns, parallel to the surface, thereby completing electrical isolation of adjacent cells.

FIG. 1 is an enlarged cross-sectional view of an embodiment of the solar cell array of the invention.

FIG. 2 is an enlarged cross-sectional view of a second embodiment of the solar cell array of the invention.

As shown in FIG. 1, the device of the invention is seen to include a monocrystalline silicon wafer 11 of N-type conductivity having a plurality of heavily doped P-type bands, or regions, 12 extending therethrough to provide electrical isolation between adjacent N-type regions. The P++ regions 12 are arranged in a rectangular matrix, or "checker board" pattern, in order to provide an array of isolated N-type regions wherein the unit solar cells are located. It will be apparent that the P++ pattern may have other geometries, so long as an array of isolated N-type regions results. For example, an "array" includes a single row or column of unit cells.

A plurality of P+ regions, 13 through 16, are formed in a corresponding plurality of isolated N-type substrate regions, to form an array of isolated PN junctions which function as the unit solar cells of the array. A plurality of N+ regions, 17 through 20, are diffused or implanted in the isolated regions and spaced from the P+ regions to provide enhancement zones for contact metallization. Of course, the enhancement zones may not be necessary in certain instances, for example, where the N-type zones already have a sufficiently low resistivity.

To complete the assembly, metallization pattern 21 is formed on oxide film 22, interconnecting each of the unit cells in series, so that the voltage output of the array equals the sum of the unit cell voltages.

Regions 12 are formed by thermomigration, which consists of forming a pattern of aluminum on the wafer surface, having the same geometry as desired for the resulting pattern of isolation regions 12, followed by heating the wafer above the melting point of aluminum while maintaining a thermal gradient through the thickness of the wafer of at least about 10° C. per cm, up to about 100° C. per cm, and preferably about 40°–60° per cm. The thermal gradient causes an aluminum-rich alloy to migrate through the N-type wafer leaving recrystallized P-type regions in their wake. A detailed discussion of such a thermomigration technique is presented by T. R. Anthony and H. E. Cline, "Lamellar Devices Processed by Thermomigration", Journal of Applied Physics, Vol. 48, No. 9, September 1977, pgs. 3943–3949.

In FIG. 2, another embodiment of the invention is shown, including monocrystalline silicon substrate 31 having a subsurface band 32 of heavily doped P-type conductivity extending parallel to the upper surface. The upper surface includes a matrix of grooves 33 having a depth slightly greater than P++ layer 32, which divide the upper surface of wafer 31 into an array of semiconductor mesas, wherein the unit cells of the solar cell array of the invention are located. As before, each cell of the array includes a P+ region, 34 through 37, diffused or implanted into an N-type region, 38 through 41; and an N+ region, 42 through 45. Finally, a metallization pattern 46 on oxide film 47 interconnects the cells in series such that the output voltage of the array is equal to the sum of the unit cell voltages. P++ layer 32 provides electrical isolation from the substrate.

A convenient method for fabrication of the embodiment of FIG. 2 includes preferably the selection of a (100)-oriented N-type wafer, and the initial step of forming a continuous surface layer of P++ conductivity by boron diffusion to the solubility limit of about $3\times 10^{20}$ cm$^{-3}$. An epitaxial layer of N-type conductivity is then grown over the P++ layer. A groove pattern is then formed, by orientation dependent etching in accordance with known techniques, with groove depth sufficient to extend through the epi layer and the P++ layer and at least a short distance into the N-type substrate. The slope of groove sidewalls in a (100) wafer is not too steep for reliable metallization. Oxide is then grown, across the entire surface, followed by selective diffusion of the P+ and N+ regions for each unit cell, and then by metallization to complete the series interconnection pattern.

In order to provide the necessary electrical isolation, the minority carrier lifetime in layer 32 of the embodiment of FIG. 2, and in region 12 of the embodiment of FIG. 1, must be no greater than about 10 nanoseconds, and preferably no more than about five nanoseconds. The width of the P++ isolation is at least two minority carrier diffusion lengths, and preferably 5-10 diffusion lengths.

A five-cell silicon array was built in accordance with the embodiment of FIG. 1. Each cell measured 0.2×0.3 cm, and the P++ isolation bands were 100 micrometers thick, containing the solubility limit of Al dopant, i.e., about $10^{21}$ atoms cm$^{-3}$. When exposed to full sunlight, the array was tested at 2.85 $V_{oc}$ and 1.4 ma $I_{sc}$.

Although monocrystalline silicon has been illustrated as the preferred semiconductor, one skilled in the art will recognize that other semiconductors are also useful in implementing the invention. Polycrystalline silicon may be used, and germanium or gallium arsenide, although not necessarily with equivalent results.

We claim:

1. An integrated solar cell array comprising a semiconductor body having a plurality of n-type regions extending to a surface thereof and isolated from each other by intervening heavily doped p-type regions; a shallow p-type region in each of said n-type regions to form a unit solar cell of said array; said semiconductor surface also including a pattern of grooves which provide lateral isolation between adjacent unit cells, wherein said heavily doped p-type regions extend between said grooves, parallel to said surface at a depth shallower than said grooves, thereby completing the isolation of said adjacent cells; and a conductive film on said surface, patterned to complete the interconnection of said cells in series, whereby the theoretical output voltage of the array is the sum of the voltages of the cells.

2. An integrated array as in claim 1 wherein the heavily doped p-type regions have a dopant concentration approaching the solubility limit.

3. An integrated array as in claim 1 wherein said semiconductor is selected from monocrystalline silicon, polycrystalline silicon, gallium arsenide, and germanium.

4. An integrated array as in claim 1 wherein said heavily doped p-type regions have a minority carrier lifetime no greater than 10 nano seconds, and a width of at least two minority carrier diffusion lengths.

* * * * *